(12) United States Patent
Fuhrmann et al.

(10) Patent No.: US 7,136,295 B2
(45) Date of Patent: Nov. 14, 2006

(54) SEMICONDUCTOR ARRANGEMENT

(75) Inventors: Dirk Fuhrmann, Essex Junction, VT (US); Reidar Lindstedt, München (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 11/123,841

(22) Filed: May 6, 2005

(65) Prior Publication Data
US 2005/0247959 A1  Nov. 10, 2005

Related U.S. Application Data

(63) Continuation of application No. PCT/DE03/003567, filed on Oct. 27, 2003.

(30) Foreign Application Priority Data

Nov. 8, 2002 (DE) ............................... 102 52 058

(51) Int. Cl.
*G11C 5/06* (2006.01)
(52) U.S. Cl. .......................... 365/63; 365/149; 365/150
(58) Field of Classification Search .................. 365/63, 365/149, 150
See application file for complete search history.

(56) References Cited

U.S. PATENT DOCUMENTS

| 4,731,643 | A | | 3/1988 | Dunham et al. |
| 5,119,169 | A | | 6/1992 | Kozono et al. |
| 5,386,129 | A | | 1/1995 | Koizumi |
| 5,867,434 | A | * | 2/1999 | Oh et al. ..................... 365/200 |
| 5,880,492 | A | | 3/1999 | Duong et al. |
| 6,154,051 | A | | 11/2000 | Nguyen et al. |
| 2004/0135190 | A1 | * | 7/2004 | Lindstedt et al. ........... 257/314 |

FOREIGN PATENT DOCUMENTS

| EP | 0 532 305 A2 | 3/1993 |
| JP | 61020349 | 1/1986 |
| JP | 01128458 | 5/1989 |
| JP | 04074465 | 3/1992 |
| JP | 08116036 | 5/1996 |

OTHER PUBLICATIONS

Kalter, H.L., et al., "An Experimental 80-ns 1-Mbit DRAM with Fast Page Operation," IEEE Journal of Solid-State Circuits, vol. Sc-20, No. 5, Oct. 1985, pp. 914-923.

* cited by examiner

*Primary Examiner*—Van Thu Nguyen
*Assistant Examiner*—Pho M. Luu
(74) *Attorney, Agent, or Firm*—Slater & Matsil, L.L.P.

(57) ABSTRACT

A semiconductor arrangement on a semiconductor chip includes a number of lines of a first type that extend outwardly from an inner region toward an outer region of the semiconductor chip. A number of lines of a second type are arranged around the inner region of the semiconductor chip. The lines of the second type are bit lines when the lines of the first type are word lines and the lines of the second type are word lines when the lines of the first type are bit lines. A number of individual element arrays are arranged along the lines of the first type and lines of the second type. The individual element arrays include memory cells.

26 Claims, 4 Drawing Sheets

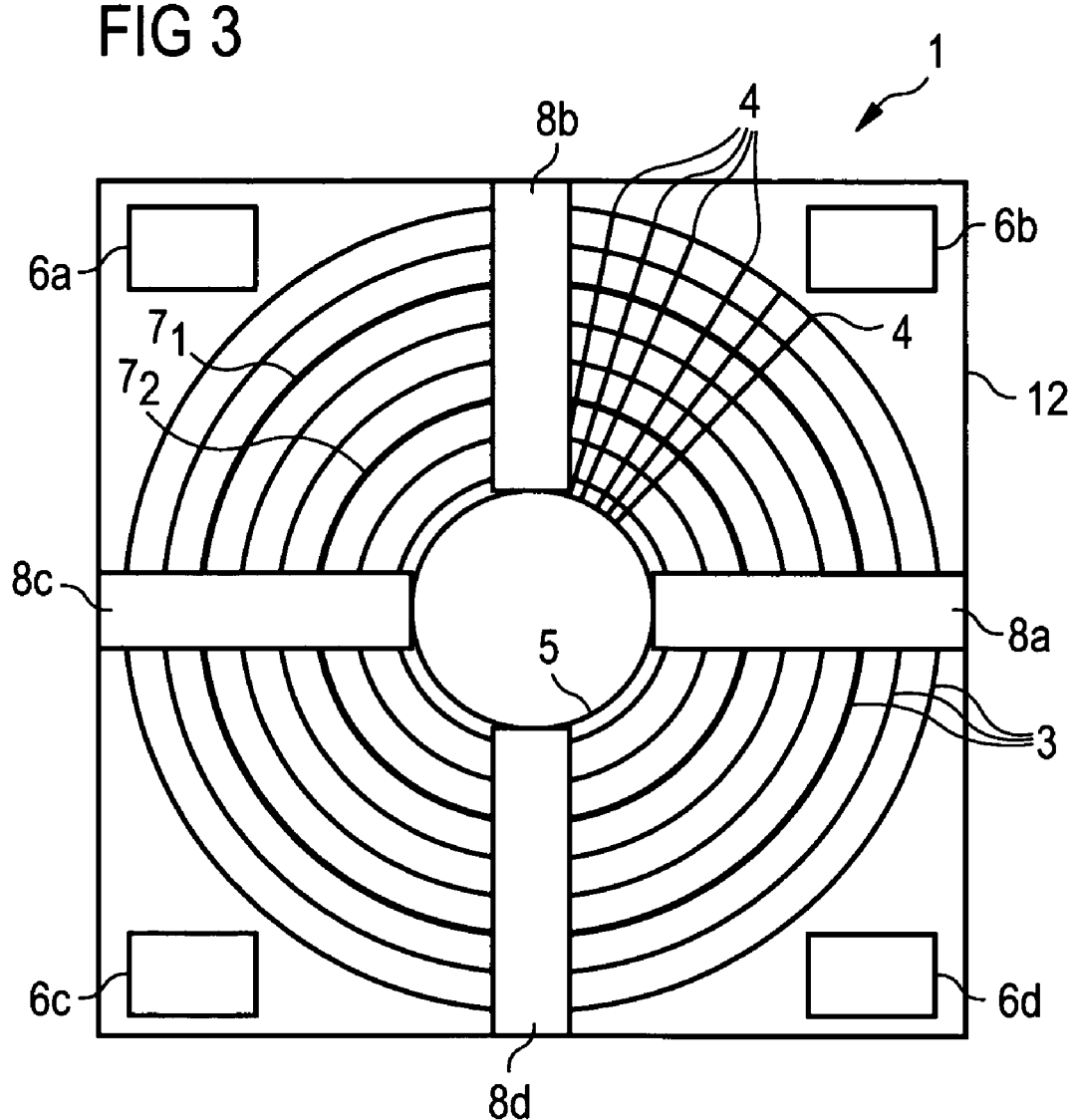

SEMICONDUCTOR ARRANGEMENT

This application is a continuation of co-pending International Application No. PCT/DE2003/003567, filed Oct. 27, 2003, which designated the United States and was published in English, and which is based on German Application No. 102 52 058.5, filed Nov. 8, 2002, both of which applications are incorporated herein by reference.

TECHNICAL FIELD

The invention relates to a semiconductor arrangement.

BACKGROUND

In the technical field of logic circuits, in particular, there is continually a desire for shorter switching times in order that the circuit operates faster overall. This increasingly leads to problems, particularly in the case of memory modules. Present-day memory modules are operated at a frequency of up to 400 MHz. Further frequency increases are envisaged for the next generations of memory modules. As the storage capacity increases at the same time, this results in extremely stringent requirements for the access time to an individual memory cell.

The fundamentally customary construction of a DRAM module is described in IEEE Journal of Solid-State Circuits, Vol. sc-20, No. 5, October 1985, pages 914 to 923. In the arrangement illustrated, a comparatively wide logic region is formed along a center axis. The logic region has, inter alia, so-called address multiplexers, address generators, read and write amplifiers, etc. Connection contacts, the so-called pads, are additionally arranged in this region. Word and bit lines are arranged in a rectangular grid on the chip. In addition to the logic region running in the longitudinal direction along the center axis, additional logic regions are provided at right angles thereto, which divide the chip into individual memory banks. Within such a memory bank, besides the individual word lines, an area for sense amplifiers is additionally arranged at a uniform distance, i.e., after a predetermined number of word lines.

As the number of memory cells continuously increases and the clock number simultaneously increases, it becomes more and more difficult to handle the access times to the individual memory cells. This means that reading from or writing to a memory cell that is arranged spatially close to the logic has to be effected just as reliably as for a memory cell that is arranged far away from the logic. As a result of the high different spatial distance, the propagation times differ greatly, however, so that at high clock rates and thus with low access times, a reliable, i.e., error-free, management of the accesses can be made possible only with a high technical outlay.

Even though the technical environment has been described on the basis of a DRAM chip hitherto, the same problem area nevertheless arises in the case of any other type of memory component, but in principle also in the case of any semiconductor arrangement in which a multiplicity of elements that are intended to be addressed with very precise timing are arranged with a high integration density.

SUMMARY OF THE INVENTION

Consequently, embodiments of the invention are based on the object of providing a semiconductor arrangement which, given a high density of circuit elements, reliably ensures a simple access to individual elements even at a high clock rate.

This object is achieved according to embodiments of the invention by virtue of the fact that, in the case of a semiconductor chip, the individual element arrays arranged along lines of a first type and lines of a second type are constructed in such a way that the lines of the first type or the lines of the second type run proceeding from an inner region in more than two directions to an outer region and the conductors of the respective other type are arranged around an inner region, the access times to the individual elements are minimal, on the one hand, and the difference in signal propagation times between inner elements with respect to outer elements can readily be estimated, on the other hand.

Further advantageous refinements of the invention are described in the specification and shown in the figures.

BRIEF DESCRIPTION OF THE DRAWINGS

The invention is described in detail below with reference to the drawing, in which:

FIG. 3 shows a development of the exemplary embodiment illustrated in FIG. 1;

FIG. 4, which includes FIG. 5, which includes

Figure 1:
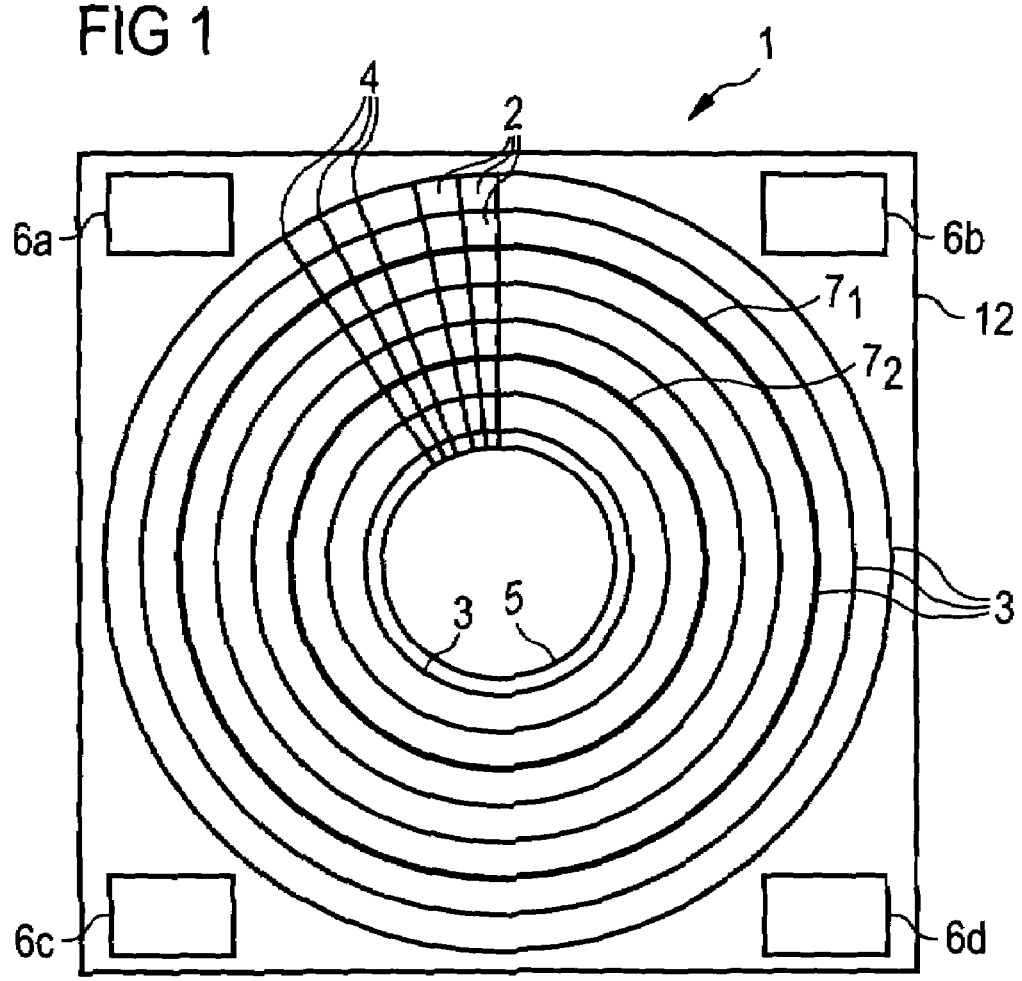
FIG. 1 shows an exemplary embodiment of a semiconductor arrangement with memory cells.

The following list of reference symbols can be used in conjunction with the figures:
1 Chip
2 Memory cells
3 Word lines
4 Bit lines
5 Central region
6 a, b, c, d Outer additional areas
$7_1$, $7_2$ Additional region for sense amplifiers
8a, b, c, d Inner additional areas
9 Bit line contact
11 Active area
12 Chip edge
C1, C2 Capacitors
T1, T2 Selection transistors transistor
A Inner region
B Outer region

DETAILED DESCRIPTION OF ILLUSTRATIVE EMBODIMENTS

FIG. 1 shows, in an exemplary embodiment, a semiconductor chip 1 that is delimited by an edge 12 and preferably has a rectangular form. The semiconductor chip 1 illustrated is intended to be a DRAM memory. A central region 5 is formed essentially centrally, the central region has a circular form. Logic circuit parts that are customary on memory modules are arranged in the central region. Memory cells 2 are arranged around the central region 5, the arrangement being formed such that the memory cells are arranged along word lines 3 formed in the form of concentric rings. There are thus a number of word lines 3. Furthermore, it is provided in accordance with FIG. 1 that a region 7 for sense amplifiers is additionally provided after a plurality of word lines.

FIG. 1 reveals additional regions provided for sense amplifiers, which are illustrated here by way of example as regions $7_1$ and $7_2$. These regions $7_1, 7_2, \ldots 7_n$ subdivide the word line regions into a plurality of segments. In the case of the arrangements that are customary at the present time, depending on the bit line length, a few hundred word lines lie between two sense amplifiers.

The illustration now shows bit lines 4 running radially proceeding from the central region 5. For the sake of clarity, FIG. 1 illustrates only a few bit lines 4 in a segment detail. The bit lines 4 are in actual fact arranged in a manner distributed uniformly over the entire circle area. In the exemplary embodiment illustrated, the bit lines 4 are arranged in a manner oriented radially with respect to the midpoint of the central region 5. As an alternative, a realization with a tangential component is possible, i.e. the bit lines are not oriented toward a central point. This means that an imaginary lengthening of the bit lines toward the center would not run toward the midpoint, but rather past the latter.

Figure 5A:
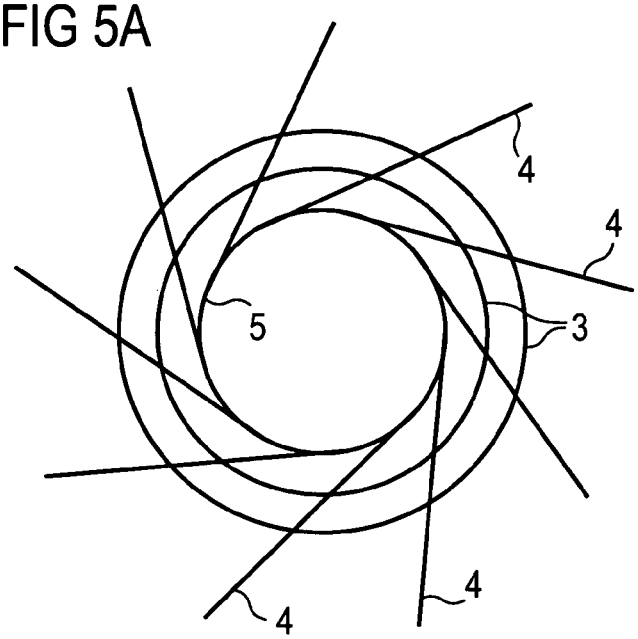
FIGS. 5a–5c, shows further exemplary line arrangements.
Figure 5B:
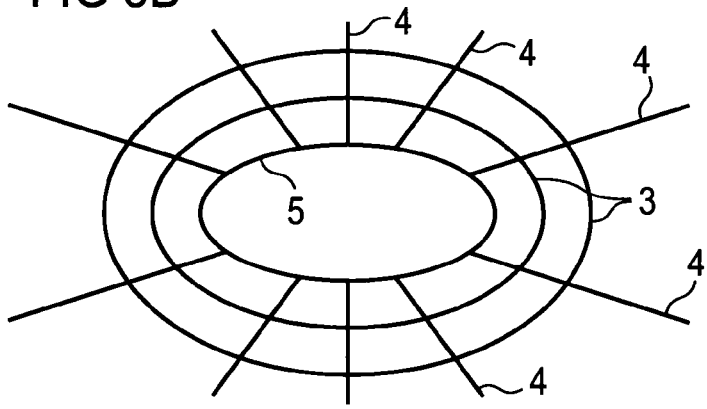
Figure 5C:
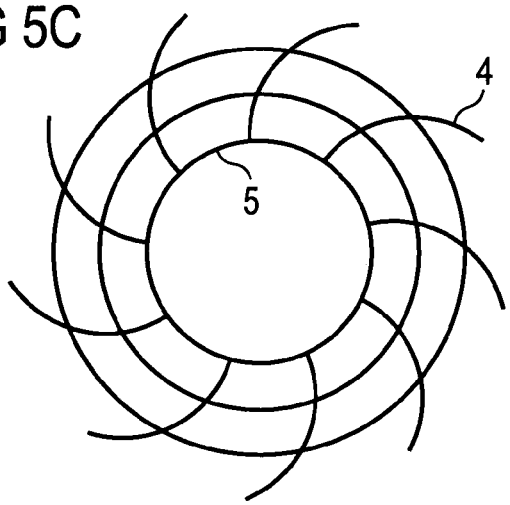

Such an arrangement is illustrated together with further line arrangements in FIG. 5, which includes FIGS. 5a–5c. This does not claim to show the complete panoply of possibilities. Rather, the intention is to demonstrate the multiplicity of possibilities. The illustration in each case symbolically shows a few bit lines 4 and word lines 3 arranged around a central region 5.

In a further variant, the invention is not restricted to a straight bit line routing. A singularly or multiply curved course can likewise be realized. Correspondingly, it is not necessary for the word lines to have a circular form. An elliptical course accords with the concept of the invention, as do comparable arrangements in which the word lines are led around the central region. This variant is likewise indicated in FIG. 5.

The memory cells 2 are arranged at the point of intersection between word and bit lines. The memory cells are arranged in the interspaces between word and bit lines. The way in which the precise arrangement, e.g., of a DRAM cell is to be provided, will be explained by way of example at a later time with reference to FIGS. 4a and 4b. The memory cells 2 that are thus arranged in a manner running radially outward circularly in concentric rings thus cover a circular area, a logic region 5 being provided around the circle midpoint.

In the case of a rectangular chip area, it is apparent in turn from this that free areas are present in corner regions of the chip. Connection areas are necessary for the operation of such a memory chip; the connection areas can be located in the corner regions. Therefore, outer additional areas 6a, 6b, 6c and 6d are provided in the four corners of the chip 1 illustrated in FIG. 1. Without illustrating the connection areas in detail, it can readily be discerned that there is enough space present for them. The additional areas 6a to 6d are also illustrated only symbolically for the outer additional areas that are actually required. The precise form and extent depend on the actual area requirement. In addition, it is possible to arrange logic circuit parts, but also circuit parts, such as voltage supplies, for example, in the outer additional areas 6a to 6d. However, the connection areas may also be formed in the central region 5.

Figure 2:
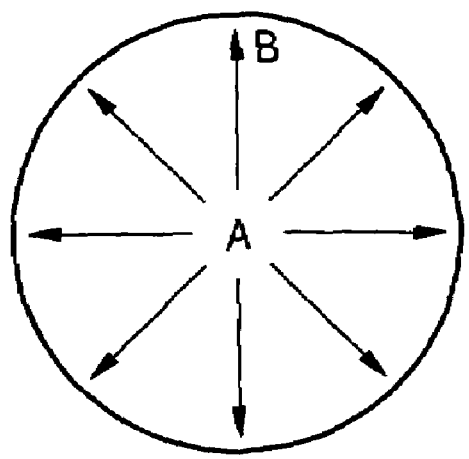
FIG. 2 shows signal propagation directions of the exemplary embodiment illustrated in FIG. 1.

The advantage of the arrangement illustrated in FIG. 1 will now be explained with reference to FIG. 2. Proceeding from an inner region A, the bit lines run in a star-shaped manner, i.e., running radially outward to the outer region B. Consequently, an identical signal propagation time holds for signals proceeding from the inner region A to all the memory cells lying in the outer region B. It is evident that each memory cell array is thus arranged at a minimal distance with respect to logic circuits if the latter are formed in the inner region A, and that all memory cells along a concentric circle can be driven with the same signal propagation time from the inner region A. This shows that the driving of the entire memory cell array, given this concentric arrangement, is simplified in terms of the temporal sequence, the so-called "timing".

FIG. 3 illustrates a development of the exemplary embodiment illustrated in FIG. 1, identical circuit parts being provided with identical reference symbols. Consequently, a renewed extensive description is dispensed with in order to avoid repetition.

In addition to the exemplary embodiment described above, FIG. 3 illustrates four inner additional areas 8a, 8b, 8c and 8d, which run from the logic region 5 to the chip edge 12. The inner additional areas 8a to 8d are illustrated as rectangular areas and divide the chip, which does not necessarily have to be square as illustrated, into four segments, which may correspond to the customary division of memory cell banks. The rectangular shape of the inner additional areas 8a to 8d is not absolutely necessary, however. It is likewise not absolutely necessary for the additional areas 8a to 8d actually to be formed right up to the physical edge 12 of the chip 1. These inner additional areas 8a to 8d may be provided for making space available for additional logic circuits or else connection areas. It is furthermore possible for individual ones of the additional areas to be omitted or further additional areas to be added. This depends solely on the space requirement, it being pointed out in this connection that the illustrations are purely schematic and not to scale.

Figure 4A:
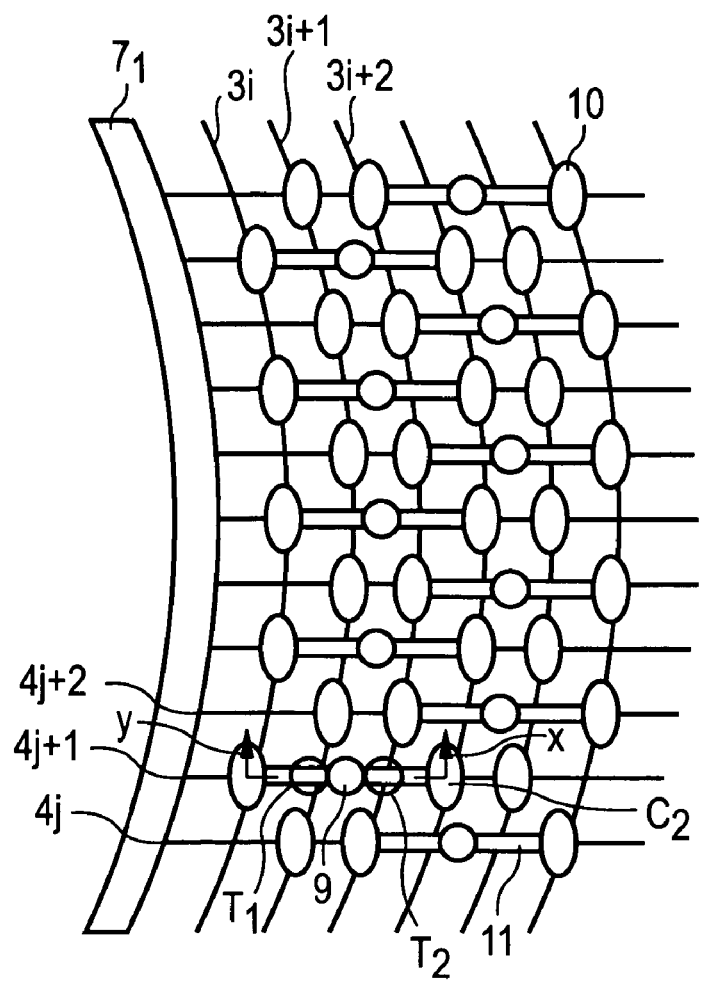
FIGS. 4a and 4b, shows an exemplary arrangement of DRAM cells in the case of the exemplary embodiment illustrated.
Figure 4B:
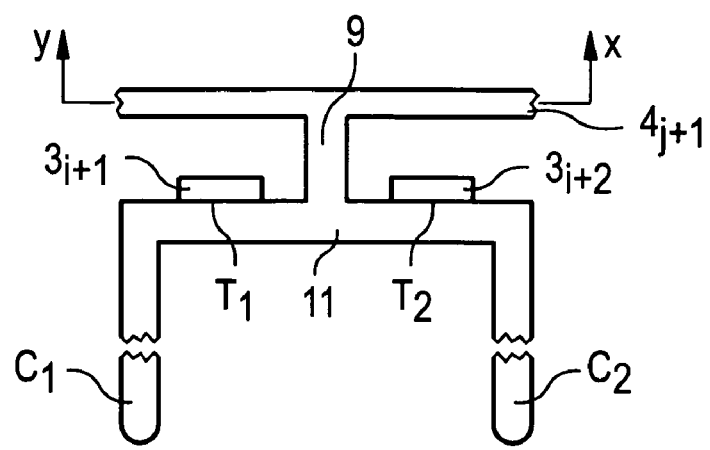

FIG. 4a illustrates in enlarged fashion a detail from the plan view of a memory cell array. Proceeding from a region $7_1$ provided for sense amplifiers, bit lines 4 are illustrated, the exemplary explanation relating to the bit lines 4j, 4j+1 and 4j+2. Arranged concentrically with respect to the region $7_1$ are word lines 3 running further outward, the explanations relating to the word lines 3i, 3i+1 and 3i+2.

Below the bit line 4j, an active area 11 for two selection transistors T1 and T2 is formed between two cell capacitors C1 and C2. In this case, the respective transistor channel is formed below the word lines 3i+1 and 3i+2. A bit line contact 9 connects the bit line 4j+1 between the two selection transistors T1 and T2 to the active area 11. This arrangement comprising two memory cells is illustrated for comparison once again in FIG. 4b in cross section along the section line X-Y. The capacitors $C_1$ and $C_2$ illustrated in the exemplary embodiment illustrated are so-called "deep trench (DT) storage capacitors". The selection transistors may be formed in vertical or horizontal technology.

On the adjacent bit lines 4j and 4j+2, the same arrangement is arranged in an offset manner, and, one bit line further in each case, the arrangement is again at the same "level" as on the bit line 4j+1. This arrangement, in which the bit line contacts are thus arranged offset by one memory cell size with respect to the adjacent bit line, enables a very high memory cell density.

In accordance with the preceding exemplary embodiments, the bit lines 4 run radially from the central region 5 to the outer region B and the word lines 3 run on concentric circles, provision being made, at predetermined intervals, of annular additional areas 7, which are provided for the arrangement of the sense amplifiers and, for example, for feeding in the voltage supply. What is not illustrated, but is equally possible in principle, is an arrangement in which the bit lines are interchanged with the word lines. This would mean that the word lines run radially outward and the bit lines run on concentric circles, the required areas for the sense amplifiers and the voltage supply then also being arranged in a manner running radially outward on segment areas after a respectively predetermined number of word lines.

In a further variant, it is possible for no additional area to be provided in the central region 5 of the arrangement. In this case, the logic is arranged on the radially running additional areas 7 and/or the additional areas 6 in the corner regions of the chip area. The same applies to the connection areas (not illustrated).

It is equally well the case that it is not a mandatory stipulation that the actual chip area is square. If there is an additional area requirement in the outer region, it is also possible to realize a rectangular chip area.

What is claimed is:

1. A semiconductor arrangement on a semiconductor chip, the semiconductor arrangement comprising:
    a plurality of lines of a first type extending outwardly from an inner region toward an outer region of the semiconductor chip, wherein the lines of the first type comprise either bit lines or word lines;
    a plurality of lines of a second type arranged around the inner region of the semiconductor chip, wherein the lines of the second type comprise bit lines when the lines of the first type comprise word lines and wherein the lines of the second type comprise word lines when the lines of the first type comprise bit lines; and
    a plurality of individual element arrays arranged along the lines of the first type and the lines of the second type, wherein the individual element arrays include memory cells.

2. The semiconductor arrangement as claimed in claim 1, wherein the lines of the second type enclose the inner region.

3. The semiconductor arrangement as claimed in claim 1, wherein the inner region includes an additional area without individual element arrays.

4. The semiconductor arrangement as claimed in claim 1, further comprising at least one additional area without individual element arrays, the at least one additional area extending from the inner region toward an edge of the semiconductor chip.

5. The semiconductor arrangement as claimed in claim 1, further comprising an additional region that is arranged around the inner region and is spaced apart from the inner region.

6. The semiconductor arrangement as claimed in claim 5, further comprising logic circuits formed in the at least one additional area.

7. The semiconductor arrangement as claimed in claim 5, wherein the semiconductor chip has a rectangular area extent, the semiconductor arrangement including at least one outer additional area arranged in corners outside the lines of the second type.

8. The semiconductor arrangement as claimed in claim 7, further comprising connection areas in the at least one outer additional area.

9. The semiconductor arrangement as claimed in claim 5, further comprising connection areas in the at least one additional area.

10. The semiconductor arrangement as claimed in claim 5, wherein after a predetermined number of word lines at least one additional area is provided and includes sense amplifiers or logic circuits formed therein.

11. The semiconductor arrangement as claimed in claim 1, wherein the lines of the first type intersect the lines of the second type at an angle of 90°.

12. The semiconductor arrangement as claimed in claim 1, wherein the lines of the first type run away tangentially from the inner region and extend to the outer region.

13. The semiconductor arrangement as claimed in claim 1, wherein the lines of the second type intersect the lines of the first type in such a way that an obtuse angle arises.

14. The semiconductor arrangement as claimed in claim 1, wherein the lines of the first type have a curved course.

15. The semiconductor arrangement as claimed in claim 1, wherein the lines of the second type run elliptically.

16. The semiconductor arrangement as claimed in claim 1, wherein the lines of the first type comprise bit lines and the lines of the second type comprise word lines.

17. The semiconductor arrangement as claimed in claim 1, wherein the lines of the first type comprise word lines and the lines of the second type comprise bit lines.

18. A memory device comprising:
    a semiconductor substrate having a substantially rectangular shape;
    an inner portion of semiconductor material defined to have a curved boundary;
    logic circuits formed in the inner portion;
    a plurality of word lines extending over the semiconductor material and around the curved boundary of the inner portion, the word lines having a curved shape that corresponds with the curved boundary;
    a plurality of bit lines extending across the word lines, the bit lines extending in a direction from the inner portion toward an outer edge of the substrate; and
    a plurality of memory cells, each memory cell located at an intersection of a word line and a bit line.

19. The device of claim 18, wherein the curved boundary comprises a substantially circular boundary.

20. The device of claim 18, wherein the memory cells comprise dynamic random access memory cells.

21. The device of claim 18, further comprising a connection area located in the inner region.

22. The device of claim 18, further comprising a connection area located in a corner region, wherein the memory cells are located between the inner region and the corner region.

23. The device of claim 18, wherein the bit lines extend in straight lines.

24. The device of claim 23, wherein the bit lines extend radially from the inner portion.

25. The device of claim 18, wherein the bit lines extend in curved lines.

26. The device of claim 18, further comprising a plurality of sense amplifier stripes, the sense amplifier stripes extending parallel and between adjacent ones of the word lines.

* * * * *